(12) United States Patent
Tian et al.

(10) Patent No.: US 12,395,002 B2
(45) Date of Patent: Aug. 19, 2025

(54) ADAPTER AND CHARGING METHOD

(71) Applicants: GUANGDONG OPPO MOBILE TELECOMMUNICATIONS CORP., LTD., Dongguan (CN); POWERLAND TECHNOLOGY INC., Nanjing (CN)

(72) Inventors: Chen Tian, Dongguan (CN); Feng Ji, Nanjing (CN); Jialiang Zhang, Dongguan (CN)

(73) Assignees: GUANGDONG OPPO MOBILE TELECOMMUNICATIONS CORP., LTD., Dongguan (CN); POWERLAND TECHNOLOGY INC., Nanjing (CN)

( * ) Notice: Subject to any disclaimer, the term of this patent is extended or adjusted under 35 U.S.C. 154(b) by 707 days.

(21) Appl. No.: 17/837,863

(22) Filed: Jun. 10, 2022

(65) Prior Publication Data

US 2022/0302738 A1 Sep. 22, 2022

Related U.S. Application Data

(63) Continuation of application No. PCT/CN2019/125402, filed on Dec. 13, 2019.

(51) Int. Cl.
*H02J 7/00* (2006.01)
*G01R 19/22* (2006.01)
(Continued)

(52) U.S. Cl.
CPC ............... *H02J 7/04* (2013.01); *G01R 19/22* (2013.01); *H01F 27/402* (2013.01);
(Continued)

(58) Field of Classification Search
USPC .......................................................... 320/164
See application file for complete search history.

(56) References Cited

U.S. PATENT DOCUMENTS 9,209,699 B1 12/2015 Wu
2012/0086393 A1 4/2012 Gray et al.
(Continued)

FOREIGN PATENT DOCUMENTS

CN 101795074 A 8/2010
CN 102099981 A 6/2011
(Continued)

OTHER PUBLICATIONS

International Search Report and Written Opinion dated Sep. 17, 2020 in International Application No. PCT/CN2019/125402. English translation attached.
(Continued)

*Primary Examiner* — Samuel Berhanu
(74) *Attorney, Agent, or Firm* — Sheppard, Mullin, Richter & Hampton LLP (57) ABSTRACT

Provided are an adapter and a charging method. The adapter includes: at least one filter capacitor (210) having a capacitance smaller than a predetermined threshold and configured to filter a rectified alternating current to obtain a pulsating direct current; and a voltage transformation module (220) configured to transform the pulsating direct current to obtain a voltage and a current for charging a device to be charged. The adapter for charging a battery is provided, the volume of the adapter can be reduced and the miniaturization of the volume of the adapter can be realized.

20 Claims, 6 Drawing Sheets

(51) Int. Cl.
*H01F 27/40* (2006.01)
*H01F 27/42* (2006.01)
*H02J 7/04* (2006.01)

(52) U.S. Cl.
CPC ........ *H01F 27/425* (2013.01); *H02J 7/00041* (2020.01); *H02J 2207/20* (2020.01)

(56) References Cited

U.S. PATENT DOCUMENTS

| | | | |
|---|---|---|---|
| 2013/0250621 A1* | 9/2013 | Manor | H02M 3/335 363/16 |
| 2014/0286058 A1* | 9/2014 | Xu | H02M 1/08 363/21.17 |
| 2016/0094131 A1 | 3/2016 | Bäurle et al. | |
| 2019/0165685 A1 | 5/2019 | Lind et al. | |

FOREIGN PATENT DOCUMENTS

| | | | |
|---|---|---|---|
| CN | 103151910 A | | 6/2013 |
| CN | 104485831 A | * | 4/2015 |
| CN | 205004816 U | | 1/2016 |
| CN | 106230082 A | | 12/2016 |
| CN | 205883072 U | | 1/2017 |
| CN | 107750425 A | | 3/2018 |
| CN | 109889062 A | | 6/2019 |
| CN | 109904913 A | | 6/2019 |
| WO | 2017143876 A1 | | 8/2017 |

OTHER PUBLICATIONS

The First Office Action from corresponding Chinese Application No. 201980101486.9 dated Jul. 27, 2024.
The second office action issued in corresponding CN application No. 201980101486.9 dated Jan. 14, 2025. 17 pages with English translation.
Extended European Search Report dated Dec. 5, 2022 received in European Patent Application No. EP19955940.2.

* cited by examiner

ADAPTER AND CHARGING METHOD

CROSS-REFERENCE TO RELATED APPLICATIONS

This application is a continuation of International Application No. PCT/CN2019/125402, filed on Dec. 13, 2019, the disclosures of which is hereby incorporated by reference in its entirety.

FIELD

The embodiments of the present disclosure relate to the field of charging technology, and more particularly, to an adapter and a charging method.

BACKGROUND

The existing adapters have a relatively large volume, which is caused by a large volume of an electrolytic capacitor for filtering, and thus they are inconvenient to carry. Therefore, it is an urgent problem to reduce the volume of the adapter.

SUMMARY

The present disclosure provides an adapter and a charging method, which can reduce the volume of the adapter and realize the miniaturization of the volume of the adapter.

In a first aspect, an adapter is provided. The adapter includes: at least one filter capacitor having a capacitance smaller than a predetermined threshold and configured to filter a rectified alternating current to obtain a pulsating direct current; and a voltage transformation module configured to transform the pulsating direct current to obtain a voltage and a current for charging a device to be charged.

In a second aspect, a charging method is provided. The charging method is applied in an adapter. The adapter includes at least one filter capacitor and a transformation module. The method includes: filtering a rectified alternating current to obtain a pulsating direct current; and transforming the pulsating direct current to obtain a voltage and a current for charging a device to be charged.

In a third aspect, a computer-readable storage medium is provided. The computer-readable storage medium has a computer program stored thereon. The computer program causes a computer to implement the method as described in the second aspect or according to any one of the embodiments thereof.

In a fourth aspect, a computer program product is provided. The computer program product includes computer program instructions. The computer program instructions cause a computer to implement the method as described in the second aspect or according to any one of the embodiments thereof.

DESCRIPTION OF EMBODIMENTS

Technical solutions in embodiments of the present disclosure will be clearly and completely described below with reference to the accompanying drawings. The embodiments as described below are some of, rather than all of the embodiments of the present disclosure. Based on the embodiments of the present disclosure, other embodiments obtained by those of ordinary skill in the art without inventive effort shall fall within the protection scope of the present disclosure.

For clearly explaining the present disclosure, the working principle and process of the adapter will be described below with reference to FIG. 1 to facilitate the subsequent understanding of the solutions of the present disclosure. However, it should be understood that the content described below is only for a better understanding of the present disclosure, and should not be construed as specific limitations of the present disclosure.

Figure 1:
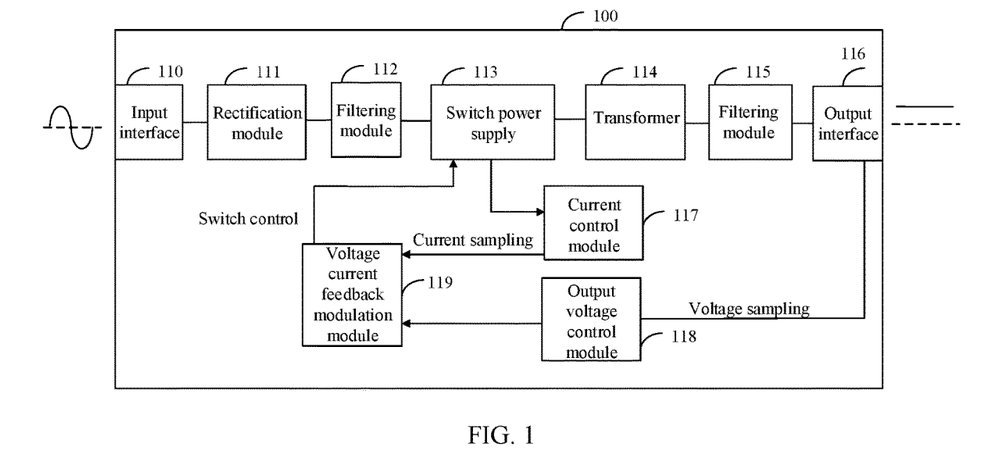
FIG. 1 is a schematic structural diagram of an adapter according to an embodiment of the present disclosure.

FIG. 1 is a schematic structural diagram of an adapter 100 according to an embodiment of the present disclosure. As illustrated in FIG. 1, the adapter 100 may include an input interface 110, a rectification module 111, a filtering module 112, a switch power supply 113, a transformer 114, a filtering module 115, an output interface 116, a current control module 117, an output voltage control module 118, and a voltage current feedback modulation module 119.

After an alternating current is input to the adapter through the input interface 110, a direct current can be obtained through a rectification processing of the rectification module 111. The direct current is filtered by the filtering module 112 to obtain a relatively stable direct current. The filtered direct current is chopped and modulated by the switch power supply 113. For example, a magnitude of an output direct current can be changed by controlling and adjusting a duty cycle of the switch power supply. The transformer 114 can lower and convert a voltage modulated by the switch power supply 113, and the filtering module 115 can further filter the direct current converted by the transformer 114, to obtain the direct voltage and the direct current required by a battery, thereby charging the battery through the charging interface.

In the embodiments of the present disclosure, the current control module 117 can sample a current output by the switch power supply 113, the output voltage control module 118 can sample an output voltage of the direct current, and the voltage current feedback modulation module 119 can control the duty cycle of the switch power supply 113 based on the sampled voltage obtained by the current control module 117 and the sampled current obtained by the output voltage control module 118, thereby adjusting the magnitude of output power of the direct current.

The adapter in the embodiments of the present disclosure is generally large in volume, and the large volume is caused by a large volume of the transformer used in the adapter, the large volume of the electrolytic capacitor for filtering, or a low degree of the integration and modularization of circuits.

The volume of the adapter in the embodiments of the present disclosure can be reduced, thereby achieving the miniaturization of the volume of the adapter.

The battery in the embodiments of the present disclosure may be a battery in an electronic device, and the "electronic device" may include, but not limited to, a satellite or cellular phone; a Personal Communication System (PCS) terminal that combines a cellular radiotelephone with data processing, facsimile, and data communication capabilities; a Personal Digital Assistant (PDA) that may include a radiotelephone, a pager, Internet/Intranet access, a Web browser, a notepad, a calendar, and/or a Global Positioning System (GPS) receiver; and a conventional laptop and/or palm receiver or any other electronic device including a radiotelephone transceiver. In some embodiments, the device to be charged may refer to a mobile terminal device or a handheld terminal device, such as a mobile phone, a pad, and the like. In some embodiments, the device to be charged mentioned in the embodiments of the present disclosure may refer to a chip system, and in these embodiments, the battery of the device to be charged may or may not belong to the chip system.

In addition, the terminal may include any other devices to be charged, which require charging, for example, a mobile phone, a mobile power supply (such as a power bank, a travel charger, etc.), an electric vehicle, a notebook computer, a drone, a tablet computer, an e-book, an electronic cigarette, a smart chargeable device, and a small electronic product, etc. The smart device to be charged may include, for example, a watch, a wristband, a pair of smart glasses, and a cleaning robot. The small electronic product may include, for example, a wireless earphone, a Bluetooth speaker, an electric toothbrush, and a rechargeable wireless mouse.

Figure 2:
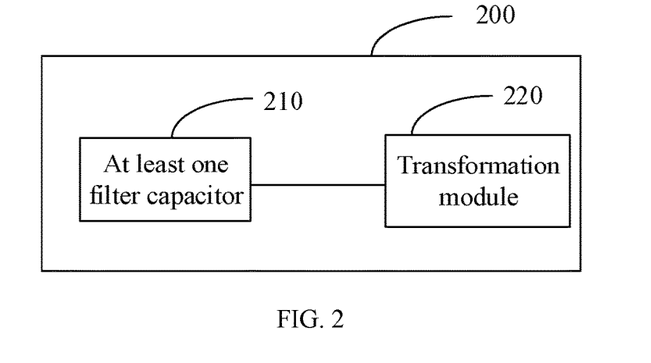
FIG. 2 is a schematic structural diagram of an adapter according to an embodiment of the present disclosure.

The adapter 200 according to an embodiment of the present disclosure is described in detail with reference to FIG. 2. The adapter 200 may include at least one filter capacitor 210 and a transformation module 220.

The at least one filter capacitor 210 has a capacitance smaller than a predetermined threshold, and is configured to filter a rectified alternating current to obtain a pulsating direct current.

The transformation module 220 is configured to transform the pulsating direct current to obtain a voltage and a current for charging a device to be charged.

The at least one capacitor 210 in the embodiment of the present disclosure may be the capacitor included in the filtering module 112 as illustrated in FIG. 1, and the transformation module 220 may include the switch power supply 113 and the transformer 114 as illustrated in FIG. 1.

The capacitance of the filter capacitor in the embodiment of the present disclosure may be smaller than the predetermined threshold, for example, smaller than 100 F. When the capacitance of the filter capacitor is smaller than the predetermined threshold, the volume of the filter capacitor is relatively small, and thus the volume of the adapter can be reduced as much as possible.

It can be understood that, in the embodiments of the present disclosure, in order to reduce the volume of the adapter, the volume of the filter capacitor may be reduced.

In other words, in the embodiments of the present disclosure, the capacitance of the filter capacitor may not be taken into consideration, as long as the volume of the adapter is reduced.

In the adapter according to the embodiments of the present disclosure, since the capacitance of the filter capacitor in the adapter is smaller than a certain threshold, the volume of the filter capacitor can be reduced, and accordingly, the volume of the adapter can be reduced, thereby realizing the miniaturization of the volume of the adapter.

Figure 3:
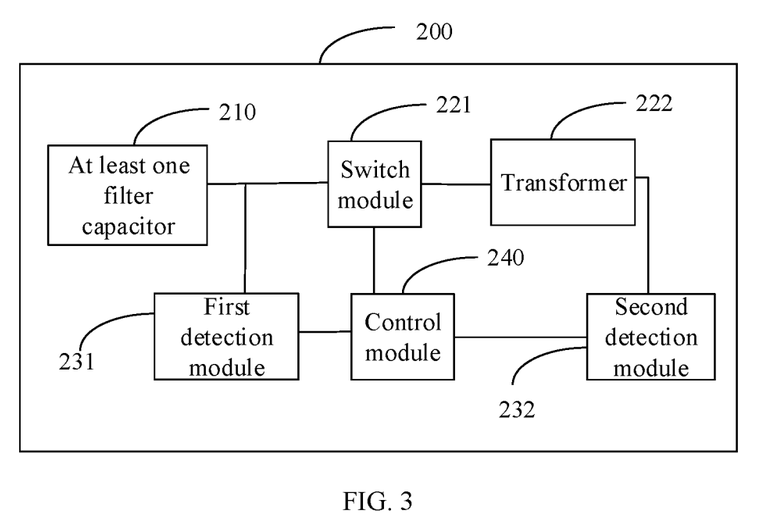
FIG. 3 is a schematic structural diagram of an adapter according to another embodiment of the present disclosure.

In some alternative embodiments, as illustrated in FIG. 3, the transformation module 220 may include a switch module 221 and a transformer 222. The adapter 200 may further include a first detection module 231 and a control module 240.

The first detection module 231 is configured to detect a voltage and/or a current of the pulsating direct current.

The control module 240 is configured to, based on a detection result of the voltage and/or the current of the pulsating direct current, control a switch-on time of the switch module to control output power of the transformer.

The switch module 221 in the embodiment of the present disclosure may be the switch power supply 113 as illustrated in FIG. 1, and the transformer 114 may be the transformer 114 as illustrated in FIG. 1. The first detection module 231 may include the current control module 117 and the output voltage control module 118 as illustrated in FIG. 1, and the control module 240 may be the voltage current feedback modulation module 119 as illustrated in FIG. 1.

In the embodiments of the present disclosure, the first detection module 231 can detect the voltage of the direct current filtered by the filter capacitor 210, so that the control module 240 can control the switch-on time of the switch module 221 based on the voltage of the direct current detected by the first detection module 231.

Similarly, the first detection module 231 can detect the current of the direct current filtered by the filter capacitor 210, so that the control module 240 can control the switch-on time of the switch module 221 based on the current of the direct current detected by the first detection module 231.

It is explained above that the control module can control the switch-on time of the switch module based on the voltage and/or current of the pulsating direct current detected by the first detection module. It will be described below in detail that the control module controls the switch-on time of the switch module based on the detected voltage of the pulsating direct current.

In some alternative embodiments, the control module is further configured to: in response to the voltage of the pulsating direct current being smaller than a first predetermined voltage threshold, reduce the switch-on time of the switch module; and/or in response to the current of the pulsating direct current being smaller than a first predetermined current threshold, reduce the switch-on time of the switch module.

In the embodiments of the present disclosure, the control based on the voltage is taken as an example for explanation. In the present disclosure, the first detection module 231 can detect the voltage of the pulsating direct current filtered by the filter capacitor 210, to control the switch-on time of the switch module 221. If the voltage of the pulsating direct current detected by the first detection module 231 is smaller than the first predetermined voltage threshold, for example, smaller than 100V, the control module 240 can control to reduce the switch-on time of the switch module 221. In this way, when an input voltage of the adapter is relatively low, the output power can be reduced, and further, the overall output efficiency of the adapter can be improved.

It should be understood that the switch-on time of the switch module 221 may be related to a current flowing through the switch module 221, that is, the longer the switch-on time of the switch module 221 is, the greater the current flowing through the switch module 221; and the shorter the switch-on time of the switch module 221 is, the smaller the current flowing through the switch module 221.

Similarly, the first detection module 231 may also detect the current of the pulsating direct current filtered by the filter capacitor 210, to control the switch-on time of the switch module 221, which is not repeated herein for brevity.

Figure 4:
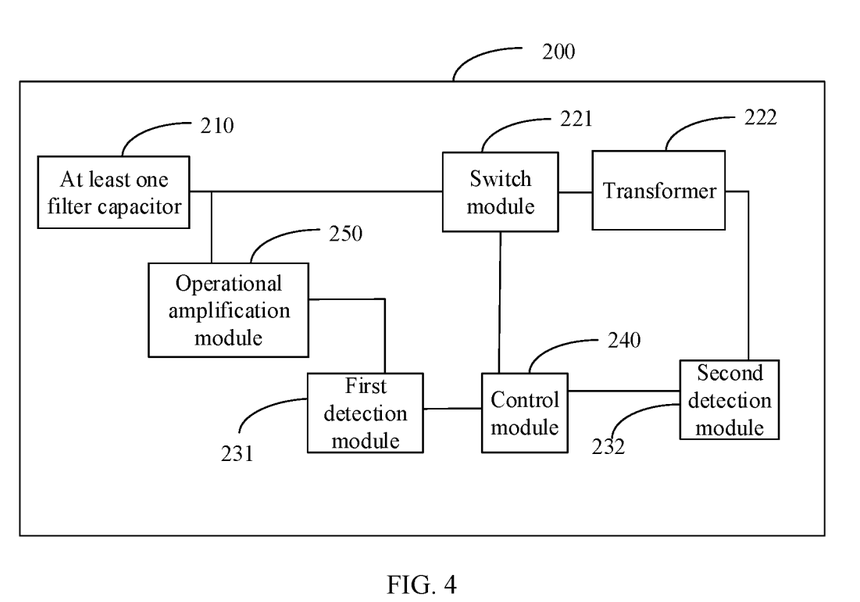
FIG. 4 is a schematic structural diagram of an adapter according to yet another embodiment of the present disclosure.

In some alternative embodiments, as illustrated in FIG. 4, the adapter may further include an operational amplification module 250.

The operational amplification module 250 is configured to convert the voltage value of the pulsating direct current into a current value. One end of the operational amplification module is connected to an output end of the at least one capacitor, and the other end thereof is connected to the first detection module. The control module is further configured to, based on the current value, control the switch-on time of the switch module, to control output power of the transformer.

In some alternative embodiments, the control module is configured to, in response to the current value being smaller than a second predetermined current threshold, reduce the switch-on time of the switch module.

In this embodiment of the present disclosure, the voltage of the pulsating direct current output by the filter capacitor 210 can be converted by the operational amplification module 250 into the current. The converted current is detected by the first detection module 231, and the control module 240 adjusts the switch-on time of the switch module 221 based on the converted current detected by the first detection module 231. If the converted current is smaller than the second predetermined current threshold, the switch-on time of the switch module 221 may be controlled to be reduced. For example, assuming that the predetermined current threshold is 50 A, if the first detection module 231 detects that the current converted by the operational amplification module 250 is 40 A, which is smaller than the second predetermined current threshold, and thus the control module 240 can control to reduce the current flowing through the switch module 221. For example, the control module 240 can control to reduce the switch-on time of the switch module 221. Therefore, the output power can be reduced when the input voltage of the adapter is relatively low, and further, the overall output efficiency of the adapter can be improved.

In some alternative embodiments, as illustrated in FIG. 4, the adapter further includes a second detection module 232.

The second detection module 232 is configured to detect a current and/or a voltage output at a secondary side of the transformer 222. The control module 240 is further configured to, based on a detection result of the current and/or voltage output at the secondary side of the transformer in combination with the detection result of the voltage and/or current of the pulsating direct current, control the switch-on time of the switch module, so as to control the output power of the transformer.

In the embodiments of the present disclosure, the control based on the voltage is taken as an example for explanation. In the present disclosure, the switch-on time of the switch module 221 can be controlled in accordance with the detected voltage output at the secondary side of the transformer 222 in combination with the voltage of the pulsating direct current. If the first detection module 231 detects that the output voltage of the secondary side of the transformer 222 is smaller than the predetermined threshold, for example, smaller than 10V, and if the voltage of the pulsating direct current is smaller than the predetermined threshold, for example, smaller than 30V, the control module 240 can control to reduce the switch-on time of the switch module. In this way, when the input voltage of the adapter is relatively low, the output power can be reduced, thereby further improving the overall output efficiency of the adapter.

The switch-on time of the switch module can be control based on the current in the similar manner as described above, which is not repeated herein for brevity.

Figure 5:
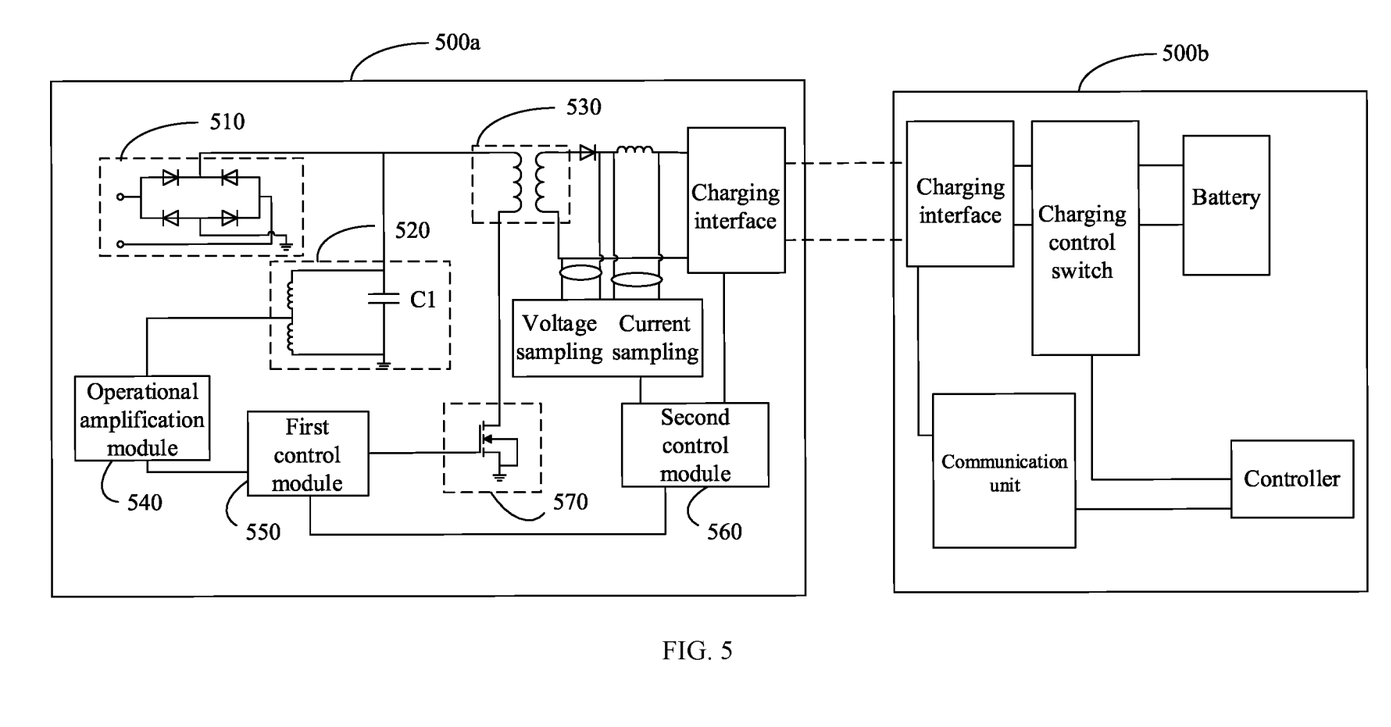
FIG. 5 is a schematic structural diagram of a charging system according to an embodiment of the present disclosure.

FIG. 5 is a schematic structural diagram of a charging system 500 according to an embodiment of the present disclosure. For example, the charging system 500 may include an adapter 500*a* and an electronic device 500*b*. The adapter 500*a* may be the adapter 200 as described above.

In the embodiment of the present disclosure, the adapter 500*a* may include a rectification module 510, a filtering module 520, a transformation module 530, an operational amplification module 540, a first control module 550, a second control module 560, and a switch module 570. In the present embodiment of the present disclosure, the filtering module 520 may include a filter C1, which may be the filter capacitor 210 as described above, the switch module 570 may be the above-mentioned switch module 221, the transformation module 530 may be the above-mentioned transformer 222, and both the first control module 550 and the second control module 560 may be the control module 240 as described above.

In the embodiments of the present disclosure, when the switch module 570 is switched-off and a power supply apparatus charges the battery through the input interface of the adapter, an alternating current input through the input interface can pass through the rectification module 510 and the filtering module 520, and can be output as a direct current, which will directly charge the battery through the conversion module 530. However, the excessive direct current may cause damage to the adapter, and thus the adapter can be further improved, which will be described in detail below.

Figure 6:
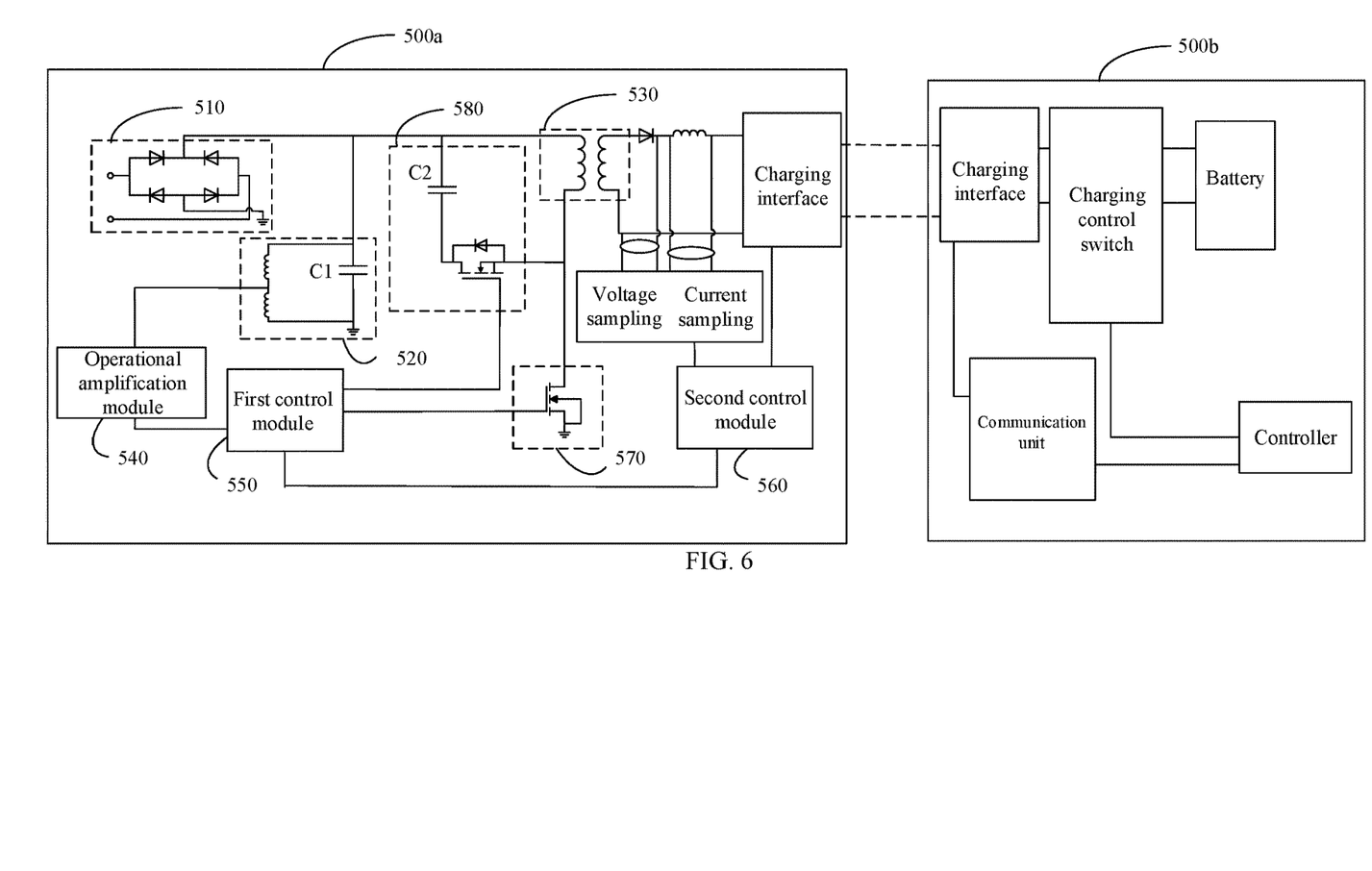
FIG. 6 is a schematic structural diagram of a charging system according to another embodiment of the present disclosure.

In some alternative embodiments, as illustrated in FIG. 6, the adapter further includes a clamping module 580 configured to, in response to the switch module being switched-off, absorb leakage inductance energy of the transformer and release the absorbed energy to an output end of the transformer.

As illustrated in FIG. 6, the control module in this embodiment of the present disclosure may be the first control module 550 as illustrated in FIG. 6. In the present embodiment of the present disclosure, one end of the clamping module is connected to the output end of the at least one filter capacitor, and the other end thereof is connected to the first control module 550.

In the present embodiment of the present disclosure, the clamping module 580 may include a capacitor C2. When the switch module 570 is switched-off, all or part of the leakage inductance energy of the transformer can be absorbed by the clamping module 580. The energy processed by the clamping module 580 can be input to the output end of the transformer for charging the battery.

Due to the presence of the clamping module 580, a switch tube included in the switch module 570 may have a reduced rigidity, and a switch tube with a lower conduction rate can be adopted, thereby reducing the cost and improving the conversion efficiency of the adapter.

It should be understood that, in the present embodiment of the present disclosure, the clamping module 580 and the switch module 570 can operate in a complementary mode. That is, when the switch module 570 is in a switch-on state, the clamping module 580 can be switched-off; and when the switch module 570 is in a switch-off state, the clamping module 580 can be connected.

For example, when the switch module 570 is in the switch-on state, the clamping module 580 can be switched-off, and thus, the direct current output by the filter can be chopped by the switch module 570 and then processed by the conversion module 530, to obtain the direct current suitable for charging the battery. When the switch module 570 is in the switch-off state, the clamping module 580 can be connected, such that part or all of the leakage inductance energy of the transformer can be absorbed by the clamping module 580, and the clamping module 580 releases the absorbed energy to the output end of the conversion module 530 for charging the battery.

In some alternative embodiments, the adapter further includes a communication module configured to receive feedback voltage information and/or feedback current information from the device to be charged. The control module is further configured to, based on the feedback voltage and/or the feedback current information in combination with the detection result of the voltage of the pulsating direct current, control the switch-on time of the switch module.

In some alternative embodiments, the adapter further includes a communication module configured to receive feedback voltage information and/or feedback current information from the device to be charged. The control module is further configured to control the switch-on time of the switch module based on at least one of: the feedback voltage information and/or the feedback current information, the detection result of the current and/or the voltage output at the secondary side of the transformer, or the detection result of the voltage and/or the current of the pulsating direct current.

In the embodiments of the present disclosure, the control based on the voltage is taken as an example for explanation. In an implementation manner, the adapter and the device to be charged can communicate with each other. The device to be charged can feed back the voltage information, input into the battery, to the adapter. After receiving the feedback voltage information from the device to be charged, the adapter determines whether to increase or reduce the switch-on time of the switch module based on the voltage information in combination with the detection result of the voltage of the pulsating direct current. If it is determined to increase the voltage value, the switch-on time of the switch module can be controlled to increase; and if it is determined to decrease the voltage value, the switch-on time of the switch module can be controlled to be reduced.

The switch-on time of the switch module can be determined based on the current in the similar manner as described above, which is not repeated herein for brevity.

Further, the control based on the voltage is still taken as an example for explanation. In another implementation manner, the adapter and the device to be charged can communicate with each other. The device to be charged can feed back the voltage information, input into the battery, to the adapter. After receiving the feedback voltage information from the device to be charged, the adapter can determine whether to increase or reduce the switch-on time of the switch module based on the voltage information in combination with the detection result of the voltage output at the secondary side of the transformer and the detection result of the voltage of the pulsating direct current. If it is determined to increase the voltage value and/or the current value, the switch-on time of the switch module can be controlled to increase; and if it is determined to decrease the voltage value and/or the current value, the switch-on time of the switch module can be controlled to be reduced.

Alternatively, the device to be charged can feed back the voltage information and/or the current information, input into the battery, to the adapter; and after receiving the feedback voltage information from the device to be charged, the adapter can determine whether to increase or reduce the switch-on time of the switch module based on the voltage information in combination with the detection result of the voltage output at the secondary side of the transformer.

Alternatively, the device to be charge can feed back the voltage information and/or the current information, input into the battery, to the adapter; and after receiving the feedback voltage information from the device to be charged, the adapter can determine whether to increase or reduce the switch-on time of the switch module based on the feedback voltage information.

The adapter in the embodiments of the present disclosure can be applied in a wired charging process. The pulsating direct current output from the adapter can be directly used to charge the electronic device.

In some alternative embodiments, the filter capacitor includes a chip capacitor, or a film capacitor, or an electrolytic capacitor having a capacitance smaller than the predetermined threshold.

The chip capacitor in the embodiments of the present disclosure may refer to a Multi-Layer Ceramic Capacitor (MLCC). The MLCC is formed by parallel stacking ceramic materials and electrode materials. The film capacitor may be formed in such manner that metal foils, as electrodes, and a plastic film such as a polyethylene, polypropylene, polystyrene or polycarbonate film are stacked at both ends, and they are then rolled into a cylindrical capacitor.

The filter capacitor in the embodiments of the present disclosure may be any other capacitors, such as a super capacitor, etc., which is not specifically limited in the present disclosure.

It should be understood that, in the case where the filter capacitor in the embodiments of the present disclosure is a chip capacitor or a film capacitor, if the capacitance of the capacitor is smaller than the predetermined threshold, the volume of the capacitor can be reduced, and accordingly, the volume of the adapter can be reduced, while the rectified alternating current can be filtered.

For the electrolytic capacitor, when the capacitance of the capacitor is smaller than the predetermined threshold, the volume of the capacitor can be reduced to realize the miniaturization of the volume of the adapter. However, when the filter capacitor is an electrolytic capacitor having a capacitance smaller than the predetermined threshold, the filtering function of the electrolytic capacitor may be affected. For example, when the capacitance of the electrolytic capacitor is relatively small, the ripples generated by the capacitor are relatively great.

In the embodiments of the present disclosure, the ripples may be caused by the voltage fluctuation of the direct current stable power supply. Since the direct current stable power supply is generally formed by the rectification and voltage regulation of the alternating current power supply, it is inevitable that some alternating current components may be present in the direct current stable quantity, and the alternating current components superimposed on the direct current stable quantity are called the ripples.

It can be understood that, although the electrolytic capacitor having a capacitance smaller than the predetermined threshold may generate relatively great ripples, the overall volume of the adapter can be reduced, and the direct current can be further filtered by the subsequent filter. Therefore, the electrolytic capacitor having the capacitance smaller than the predetermined threshold can be applied in the embodiments of the present disclosure.

In the adapter according to the embodiments of the present disclosure, the filter capacitor in the adapter may be a chip capacitor, or a film capacitor, or an electrolytic capacitor having a capacitance smaller than the predetermined threshold. The chip capacitor, or the film capacitor, or the electrolytic capacitor, when having a capacitance smaller than the predetermined threshold, has a relatively smaller volume, and thus the volume of the adapter can be reduced. In addition, the chip capacitor or film capacitor having the relatively smaller capacitance can withstand relatively greater ripples, and thus, compared with the electrolytic capacitor having the capacitance smaller than the predetermined threshold, it has a better effect, i.e., it can well achieve the miniaturization of the volume of the adapter and withstand the relatively greater ripples caused by the reduction of the capacitance.

Figure 7A:
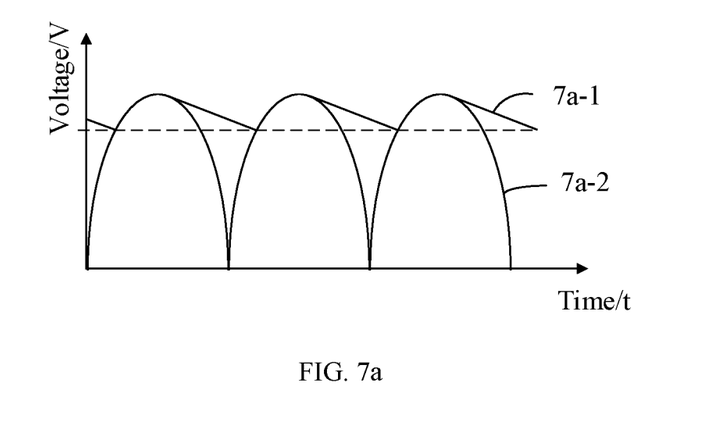
FIG. 7a is a schematic graph of an output voltage of adapters with different filter capacitors over time during a charging process according to the present disclosure.
Figure 7B:
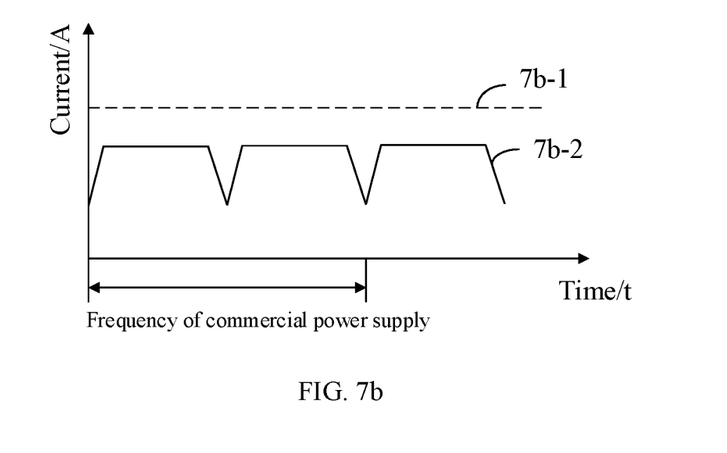
FIG. 7b is a schematic graph of an output current of adapters with different filter capacitors over time during a charging process according to the present disclosure.

In the embodiments of the present disclosure, as illustrated in FIG. 7, when a chip capacitor, or a film capacitor, or an electrolytic capacitor having a capacitance smaller than the predetermined threshold is used as the capacitor in the filtering module, the adapter may output the pulsating direct current.

FIG. 7a is a schematic graph of an output voltage of adapters with different filter capacitors over time during a charging process according to the present disclosure. As illustrated in FIG. 7a, the curve 7a-1 is a changing curve of the output voltage of the adapter over time during the charging process, in which the filter capacitor is an electrolytic capacitor having a capacitance greater than the predetermined threshold; and the curve 7a-2 is a changing curve of the output voltage of the adapter over time during the charging process, in which the filter capacitance is a chip capacitor, or a film capacitor, or an electrolytic capacitor having a capacitance smaller than the predetermined threshold.

It can be seen from FIG. 7a that, when the adapter adopts the electrolytic capacitor having the capacitance greater than the predetermined threshold, the output voltage is a relatively stable constant direct voltage; and when the adaptor adopts the chip capacitor, or the film capacitor, or the electrolytic capacitor having the capacitance smaller than the predetermined threshold instead of the electrolytic capacitor having the capacitance greater than the predetermined threshold, the voltage output by the adapter is the pulsating direct voltage.

FIG. 7b is a schematic graph of an output current of adapters with different filter capacitors over time during a charging process according to the present disclosure. As shown in FIG. 7b, the curve 7b-1 is a changing curve of the output current f the adapter over time during the charging process, in which the filter capacitance is an electrolytic capacitor having a capacitance greater than the predetermined threshold; and the curve 7b-2 is a changing curve of the output current of the adapter over time during the charging process, in which the filter capacitor is a chip capacitor, or a film capacitor, or an electrolytic capacitor having a capacitance smaller than the predetermined threshold.

It can be seen from FIG. 7b that, when the adapter adopts the electrolytic capacitor having the capacitance greater than the predetermined threshold, the output current is a relatively stable constant direct current; and when the adaptor adopts the chip capacitor, or the film capacitor, or the electrolytic capacitor having the capacitance smaller than the predetermined threshold, the frequency of the pulsating direct current can be the same as the frequency of the commercial power supply.

In the embodiment of the present disclosure, since the filter capacitor adopts the chip capacitor, or the film capacitor, or the electrolytic capacitor having the capacitance smaller than the predetermined threshold, the adapter outputs the pulsating direct current. When the adapter charges the electronic device, the electronic device is not charged continuously with a large current. That is, after the electronic device is charged with a large current for a period of time, the current can be reduced or even stopped to reduce the battery loss, and thus the service life of the battery can be prolonged.

In some alternative embodiments, the number of the filter capacitors is determined by the required capacitance.

In some alternative embodiments, a plurality of capacitors connected in series or a plurality of capacitors connected in parallel is provided.

In this embodiment of the present disclosure, one or more of the filter capacitors may be provided, which may be determined based on the required capacitance. A plurality of capacitors connected in series or a plurality of capacitors connected in parallel is provided in this embodiment of the present disclosure.

Specifically, assuming that the required capacitance is 10 uF and the capacitance of one filter capacitor is 5 uF, two filter capacitors can be connected in parallel to meet the required capacitance. If the capacitance of one filter capacitor is 20 uF, two filter capacitors can be connected in series to meet the required capacitance.

It should be understood that the above numerical values are only for illustration, and other numerical values may also be used, which should not construct limitation on the present disclosure.

The apparatus embodiments of the present disclosure are described in detail above with reference to FIG. 1 to FIG. 7, and the method embodiments of the present disclosure are described below with reference to FIG. 8. The method embodiments correspond to the apparatus embodiments, and those not described in detail may refer to the apparatus embodiments.

Figure 8:
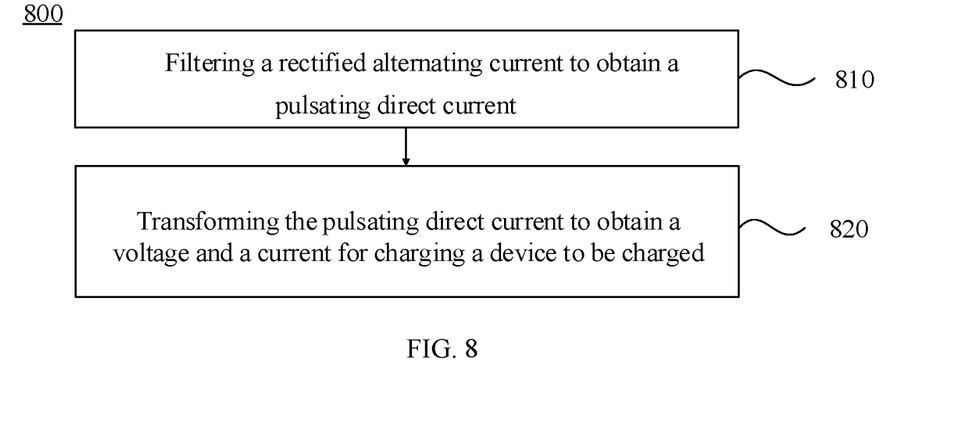
FIG. 8 is a schematic flowchart of a charging method according to an embodiment of the present disclosure.

FIG. 8 is a charging method 800 according to an embodiment of the present disclosure. The method 800 may be applied in an adapter, and the adapter may include at least one filter capacitor and a voltage transformation module. The method 800 may include actions in blocks 810 to 820.

In block 810, a rectified alternating current is filtered to obtain a pulsating direct current.

In block 820, the pulsating direct current is transformed to obtain a voltage and a current for charging a device to be charged.

In some alternative embodiments, the adapter further includes a first detection module and a control module. The transformation module includes a switch module and a transformer. The method 800 further includes: detecting a voltage and/or a current of the pulsating direct current; and controlling a switch-on time of the switch module based on a detection result of the voltage and/or the current of the pulsating direct current, to control output power of the transformer.

In some alternative embodiments, said controlling the switch-on time of the switch module based on the detection result of the voltage and/or the current of the pulsating direct current includes: reducing the switch-on time of the switch module in response to the voltage of the pulsating direct current being smaller than a first predetermined voltage threshold; and/or reducing the switch-on time of the switch module in response to the current of the pulsating direct current being smaller than a first predetermined current threshold.

In some alternative embodiments, the adapter further includes an operational amplification module. One end of the operational amplification module is connected to an output end of the at least one capacitor, and the other end thereof is connected to the first detection module. The method 800 further includes: converting the voltage value of the pulsating direct current into a current value. Said controlling the switch-on time of the switch module based on the detection result of the voltage and/or the current of the pulsating direct current includes: controlling the switch-on time of the switch module based on the current value.

In some alternative embodiments, said controlling the switch-on time of the switch module based on the current value includes: reducing the switch-on time of the switch module in response to the current value being smaller than a second predetermined current threshold.

In some alternative embodiments, the adapter further includes a second detection module. The method 800 further includes: detecting a current and/or a voltage output at a secondary side of the transformer. Said controlling the switch-on time of the switch module based on the detection result of the voltage and/or the current of the pulsating direct current includes: controlling the switch-on time of the switch module based on the detection result of the current and/or the voltage output at the secondary side of the transformer, in combination with the detection result of the voltage and/or the current of the pulsating direct power, to control the output power of the transformer.

In some alternative embodiments, the method 800 further includes: in response to the switch module being switched-off, absorbing leakage inductance energy of the transformer, and releasing the absorbed energy to an output end of the transformer.

In some alternative embodiments, the adapter further includes a communication module. The method 800 further includes: receiving feedback voltage information and/or feedback current information from the device to be charged. Said controlling the switch-on time of the switch module based on the detection result of the voltage and/or the current of the pulsating direct current includes: controlling the switch-on time of the switch module based on the feedback voltage information and/or the feedback current information, in combination with the detection result of the voltage and/or the current of the pulsating direct current.

In some alternative embodiments, the adapter further includes a communication module. The method 800 further includes: receiving feedback voltage information and/or feedback current information from the device to be charged. Said controlling the switch-on time of the switch module based on the detection result of the current and/or the voltage output at the secondary side of the transformer, in combination with the detection result of the voltage and/or the current of the pulsating direct power includes: controlling the switch-on time of the switch module based on at least one of: the feedback voltage information and/or the feedback current information, the detection result of the current and/or the voltage output at the secondary side of the transformer, and the detection result of the voltage and/or the current of the pulsating direct current.

In some alternative embodiments, the filter capacitor includes a chip capacitor or a film capacitor.

In some alternative embodiments, the number of the at least one filter capacitor is determined by a required capacitance.

In some alternative embodiments, a plurality of capacitors connected in series or a plurality of capacitors connected in parallel is provided.

Embodiments of the present disclosure further provide a computer-readable storage medium, having computer-executable instructions stored thereon. The computer-executable instructions are configured to implement any one of the above-mentioned charging methods 800.

Embodiments of the present disclosure further provide a computer program product. The computer program product includes a computer program stored on a computer-readable storage medium. The computer program includes program instructions. The program instructions, when executed by a computer, causes a computer to implement any one of the above-mentioned charging methods 800.

The solutions in the embodiments of the present disclosure may be applied in the wired charging process or in the wireless charging process, which are not specifically limited in the embodiments of the present disclosure.

The wired charging process applied in the embodiments of the present disclosure will be described below with reference to FIG. 9.

Figure 9:
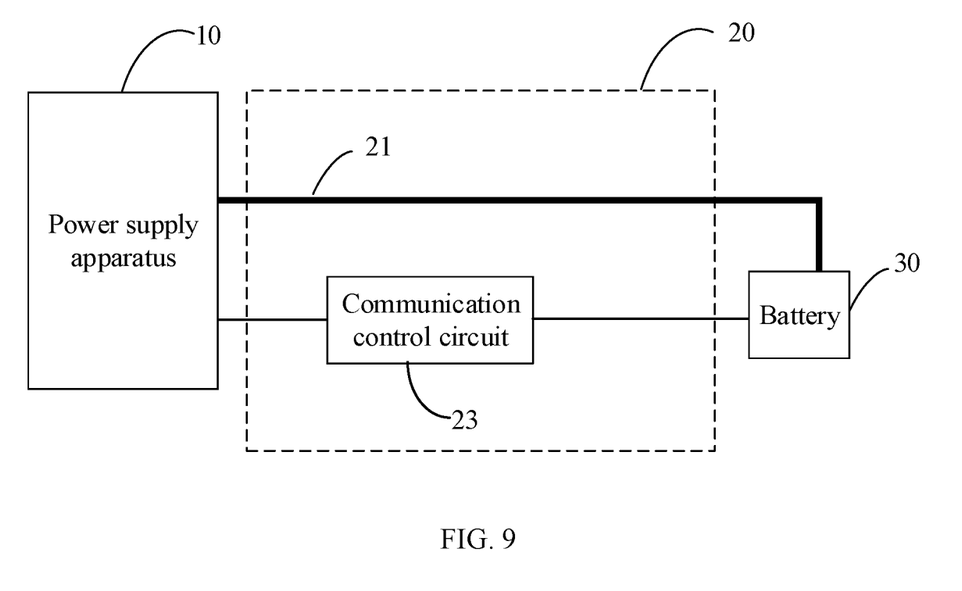
FIG. 9 is a schematic structural diagram of a wired charging system according to an embodiment of the present disclosure.

FIG. 9 is a schematic structural diagram of a charging system according to an embodiment of the present disclosure. The charging system includes a power supply apparatus 10, a battery management circuit 20, and a battery 30. The battery management circuit 20 may be configured to manage the battery 30. The power supply apparatus 10 in the embodiments of the present disclosure may be the above-mentioned adapter 200 or 500a.

As an example, the battery management circuit 20 can manage the charging process of the battery 30, such as selecting a charging channel, controlling the charging voltage and/or charging current, etc. As another example, the battery management circuit 20 may manage the cells of the battery 30, such as equalizing the voltage of the cells in the battery 30, etc.

The battery management circuit 20 may include a first charging channel 21 and a communication control circuit 23.

The first charging channel 21 can be configured to receive the charging voltage and/or charging current provided by the power supply apparatus 10, and apply the charging voltage and/or charging current to both ends of the battery 30 to charge the battery 30.

The power supply apparatus 10 may be the power supply apparatus with adjustable output voltage as described above, but the type of the power supply apparatus 10 is not specifically limited in the embodiments of the present disclosure. For example, the power supply apparatus 10 may be a device specific for charging, such as an adapter and a power bank, or other devices that can provide power and data services, such as a computer.

The first charging channel 21 can be a direct charging channel, which can apply the charging voltage and/or charging current provided by the power supply adapter 10 directly on both ends of the battery 30. In order to implement the direct charging method, a control circuit with a communication function, i.e., a communication control circuit 23, is introduced into the battery management circuit 20 in this embodiment of the present disclosure. The communication control circuit 23 can keep in communication with the power supply apparatus 10 during the direct charging process to form a closed-loop feedback mechanism. In this way, the power supply apparatus 10 can acquire the state of the battery in real time, so as to continuously adjust the charging voltage and/or charging current supplied to the first charging channel. In this way, it is ensured that the charging voltage and/or charging current provided by the power supply apparatus 10 matches the current required voltage and/or current of the battery 30.

The solutions in the embodiments of the present disclosure can be applied in the wireless charging process.

In the traditional wireless charging technology, a power supply apparatus (such as an adapter) is generally connected to a wireless charging apparatus (such as a wireless charging base), and output power of the power supply apparatus is transmitted wirelessly (such as in electromagnetic waves) to a device to be charged through the wireless charging apparatus, and the device to be charged is charged. The device to be charged may be the electronic device described above.

According to different wireless charging principles, wireless charging methods are mainly divided into three methods: magnetic coupling (or electromagnetic induction), magnetic resonance and radio waves. At present, the mainstream wireless charging standards include the QI standard, the power matters alliance (PMA) standard, and the alliance for wireless power (A4WP). Both the QI standard and the PMA standard use magnetic coupling for wireless charging. The A4WP standard uses magnetic resonance for wireless charging.

In the above embodiments, it may be implemented completely or in part by software, hardware, firmware or any other combination. When implemented in software, it can be implemented completely or in part in the form of a computer program product. The computer program product includes one or more computer instructions. When the computer program instructions are loaded and executed on a computer, all or part of the processes or functions described in the embodiments of the present disclosure are generated. The computer may be a general purpose computer, an application specified computer, a computer network, or other programmable apparatus. The computer instructions may be stored in a computer-readable storage medium, or transmitted from one computer-readable storage medium to another computer-readable storage medium, for example, the computer instructions may be transmitted from a website site, a computer, a server, or data center to another website site, computer, server, or data center by wire (e.g., a coaxial cable, an optical fiber, a Digital Subscriber Line (DSL)) or wireless (e.g., infrared, wireless, microwave, etc.). The computer-readable storage medium may be any available medium that is accessible to a computer, or a data storage device such as a server, a data center, etc., which includes an integration of one or more available media. The available media may be magnetic media (e.g., floppy disks, hard disks, magnetic tapes), optical media (e.g., Digital Video Disc (DVD)), or semiconductor media (e.g., Solid State Disk (SSD)), etc.

Those of ordinary skill in the art can realize that the units and algorithm steps of each example described in conjunction with the embodiments can be implemented in electronic hardware, or a combination of computer software and electronic hardware. Whether these functions are performed in hardware or software depends on the specific application and design constraints of the technical solution. Those of ordinary skill in the art may implement the described functionality using different methods for each particular application, but such implementations should not be considered beyond the scope of the present disclosure.

In the several embodiments provided in the present disclosure, it should be understood that the disclosed system, apparatus and method may be implemented in other manners. For example, the apparatus embodiments described above are only illustrative. For example, the division of the units is only a logical function division. In actual implementation, there may be other division methods. For example, multiple units or components may be combined or may be integrated into another system, or some features can be ignored, or not implemented. On the other hand, the illustrated or discussed mutual coupling or direct coupling or communication connection may be through some interfaces, and indirect coupling or communication connection between apparatuses or units may be in electrical, mechanical or other forms.

Although the terms "first," "second," etc. may be used in the present disclosure to describe various devices, these devices should not be limited by these terms. These terms are only used to distinguish one device from another. For example, without changing the meaning of the description, a first device may be referred to as a second device, and similarly, a second device may be referred to as a first device, as long as the "first device" is uniformly renamed and the "second device" is uniformly renamed. The first device and the second device are both devices, but may not be the same device.

The units described as separate components may or may not be physically separated, and components displayed as units may or may not be physical units, that is, may be located in one place, or may be distributed to multiple network units. Some or all of the units may be selected according to actual needs to achieve the purpose of the solutions in the embodiments.

In addition, respective functional units in each embodiment of the present disclosure may be integrated into one processing unit, or each unit may exist physically alone, or two or more units may be integrated into one unit.

The above are only specific embodiments of the present disclosure, and the protection scope of the present disclosure is not limited thereto. The modifications or substitutions, which are made by those skilled in the art without departing from the technical scope, should fall within the protection scope of the present disclosure. Therefore, the protection scope of the present disclosure should be defined by the protection scope of the claims.

What is claimed is:

1. An adapter, comprising:
   at least one filter capacitor having a capacitance smaller than a predetermined threshold and configured to filter a rectified alternating current to obtain a pulsating direct current; and
   a voltage transformation module configured to transform the pulsating direct current to obtain a voltage and a current for charging a device to be charged;
   wherein the voltage transformation module comprises: a switch module and a transformer, and wherein the adapter further comprises:
   a first detection module configured to detect a voltage and/or a current of the pulsating direct current; and
   a control module configured to control a switch-on time of the switch module based on a detection result of the voltage and/or the current of the pulsating direct current, to control output power of the transformer;
wherein the adapter further comprises:
an operational amplification module configured to convert a voltage value of the pulsating direct current into a current value, wherein the operational amplification module has one end connected to an output end of the at least one capacitor, and another end thereof connected to the first detection module,
wherein the control module is further configured to:
control the switch-on time of the switch module based on the current value, to control the output power of the transformer.

2. The adapter according to claim 1, wherein the control module is further configured to:
reduce the switch-on time of the switch module in response to the voltage of the pulsating direct current being smaller than a first predetermined voltage threshold; and/or
reduce the switch-on time of the switch module in response to the current of the pulsating direct current being smaller than a first predetermined current threshold.

3. The adapter according to claim 1, wherein the control module is configured to reduce the switch-on time of the switch module in response to the current value being smaller than a second predetermined current threshold.

4. The adapter according to claim 1, further comprising a second detection module configured to detect a current and/or a voltage output at a secondary side of the transformer,
wherein the control module is further configured to:
control the switch-on time of the switch module based on a detection result of the current and/or the voltage output at the secondary side of the transformer in combination with the detection result of the voltage and/or the current of the pulsating direct current, to control the output power of the transformer.

5. The adapter according to claim 1, further comprising a clamping module configured to:
absorb, in response to the switch module being switched-off, leakage inductance energy of the transformer; and
release the absorbed energy to an output end of the transformer.

6. The adapter according to claim 1, further comprising a communication module configured to receive feedback voltage information and/or feedback current information from the device to be charged,
wherein the control module is further configured to control the switch-on time of the switch module based on the feedback voltage information and/or the feedback current information in combination with the detection result of the voltage and/or the current of the pulsating direct current.

7. The adapter according to claim 4, further comprising a communication module configured to receive feedback voltage information and/or feedback current information from the device to be charged,
wherein the control module is further configured to control the switch-on time of the switch module based on at least one of:
the feedback voltage information and/or the feedback current information;
the detection result of the current and/or the voltage output at the secondary side of the transformer; or
the detection result of the voltage and/or the current of the pulsating direct current.

8. The adapter according to claim 1, wherein the at least one filter capacitor comprises a chip capacitor, or a film capacitor, or an electrolytic capacitor having a capacitance smaller than the predetermined threshold, and
wherein the number of the at least one filter capacitor is determined by a required capacitance.

9. A charging method, applied to an adapter comprising at least one filter capacitor and a transformation module, the method comprising:
filtering a rectified alternating current to obtain a pulsating direct current; and
transforming the pulsating direct current to obtain a voltage and a current for charging a device to be charged;
wherein the adapter further comprises a first detection module and a control module, and wherein the transformation module comprises a switch module and a transformer, the method further comprising:
detecting a voltage and/or a current of the pulsating direct current; and
controlling a switch-on time of the switch module based on a detection result of the voltage and/or the current of the pulsating direct current, to control output power of the transformer;
wherein the adapter further comprises an operational amplification module, the operational amplification module having one end connected to an output end of the at least one capacitor and another end connected to the first detection module, the method further comprising converting a voltage value of the pulsating direct current into a current value,
wherein said controlling the switch-on time of the switch module based on the detection result of the voltage and/or the current of the pulsating direct current comprises:
controlling the switch-on time of the switch module based on the current value.

10. The method according to claim 9, wherein said controlling the switch-on time of the switch module based on the detection result of the voltage and/or the current of the pulsating direct current comprises:
reducing the switch-on time of the switch module in response to the voltage of the pulsating direct current being smaller than a first predetermined voltage threshold; and/or
reducing the switch-on time of the switch module in response to the current of the pulsating direct current being smaller than a first predetermined current threshold.

11. The method according to claim 9, wherein said controlling the switch-on time of the switch module based on the current value comprises:
reducing the switch-on time of the switch module in response to the current value being smaller than a second predetermined current threshold.

12. The method according to claim 9, wherein the adapter further comprises a second detection module,
wherein the method further comprises detecting a current and/or a voltage output at a secondary side of the transformer, and
wherein said controlling the switch-on time of the switch module based on the detection result of the voltage and/or the current of the pulsating direct current comprises:
controlling the switch-on time of the switch module based on the detection result of the current and/or the voltage output at the secondary side of the transformer in combination with the detection result of the voltage and/or the current of the pulsating direct power, to control the output power of the transformer.

13. The method according to claim 9, further comprising:
absorbing, in response to the switch module being switched-off, leakage inductance energy of the transformer; and
releasing the absorbed energy to an output end of the transformer.

14. The method according to claim 9, wherein the adapter further comprises a communication module, the method further comprising:
receiving feedback voltage information and/or feedback current information from the device to be charged,
wherein said controlling the switch-on time of the switch module based on the detection result of the voltage and/or the current of the pulsating direct current comprises:
controlling the switch-on time of the switch module based on the feedback voltage information and/or the feedback current information in combination with the detection result of the voltage and/or the current of the pulsating direct current.

15. The method according to claim 12, wherein the adapter further comprises a communication module, the method further comprising:
receiving feedback voltage information and/or feedback current information from the device to be charged,
wherein said controlling the switch-on time of the switch module based on the detection result of the current and/or the voltage output at the secondary side of the transformer in combination with the detection result of the voltage and/or the current of the pulsating direct power comprises:
controlling the switch-on time of the switch module based on at least one of:
the feedback voltage information and/or the feedback current information;
the detection result of the current and/or the voltage output at the secondary side of the transformer; or
the detection result of the voltage and/or the current of the pulsating direct current.

16. A computer-readable storage medium, having computer-executable instructions stored thereon, wherein the computer-executable instructions are configured to implement a charging method, applied to an adapter comprising at least one filter capacitor and a transformation module, the method comprising:
filtering a rectified alternating current to obtain a pulsating direct current; and
transforming the pulsating direct current to obtain a voltage and a current for charging a device to be charged-;
wherein the adapter further comprises a first detection module and a control module, and wherein the transformation module comprises a switch module and a transformer, the method further comprising:
detecting a voltage and/or a current of the pulsating direct current; and
controlling a switch-on time of the switch module based on a detection result of the voltage and/or the current of the pulsating direct current, to control output power of the transformer;
wherein the adapter further comprises an operational amplification module, the operational amplification module having one end connected to an output end of the at least one capacitor and another end connected to the first detection module, the method further comprising converting a voltage value of the pulsating direct current into a current value,
wherein said controlling the switch-on time of the switch module based on the detection result of the voltage and/or the current of the pulsating direct current comprises:
controlling the switch-on time of the switch module based on the current value.

17. The computer-readable storage medium of claim 16, wherein said controlling the switch-on time of the switch module based on the detection result of the voltage and/or the current of the pulsating direct current comprises:
reducing the switch-on time of the switch module in response to the voltage of the pulsating direct current being smaller than a first predetermined voltage threshold; and/or
reducing the switch-on time of the switch module in response to the current of the pulsating direct current being smaller than a first predetermined current threshold.

18. The computer-readable storage medium of claim 16, wherein said controlling the switch-on time of the switch module based on the current value comprises:
reducing the switch-on time of the switch module in response to the current value being smaller than a second predetermined current threshold.

19. The computer-readable storage medium of claim 16, wherein the adapter further comprises a second detection module,
wherein the method further comprises detecting a current and/or a voltage output at a secondary side of the transformer, and
wherein said controlling the switch-on time of the switch module based on the detection result of the voltage and/or the current of the pulsating direct current comprises:
controlling the switch-on time of the switch module based on the detection result of the current and/or the voltage output at the secondary side of the transformer in combination with the detection result of the voltage and/or the current of the pulsating direct power, to control the output power of the transformer.

20. The computer-readable storage medium of claim 16, further comprising:
absorbing, in response to the switch module being switched-off, leakage inductance energy of the transformer; and
releasing the absorbed energy to an output end of the transformer.

* * * * *